United States Patent [19]

Dowling et al.

[11] Patent Number: 4,508,399

[45] Date of Patent: Apr. 2, 1985

[54] POLARIZED RIBBON CABLE CONNECTOR HAVING CIRCUIT COMPONENTS THEREIN

[75] Inventors: Edward C. Dowling, Harrisburg; Jon A. Fortuna, New Cumberland, both of Pa.

[73] Assignee: AMP Incorporated, Harrisburg, Pa.

[21] Appl. No.: 567,458

[22] Filed: Jan. 3, 1984

[51] Int. Cl.[3] .............................................. H05K 1/00

[52] U.S. Cl. ............................ 339/17 CF; 339/99 R; 339/176 MF

[58] Field of Search .............. 339/17 CF, 17 F, 97 R, 339/97 P, 98, 99 R, 176 MF, 198 GA, 75 M, 75 MP, 147 R, 147 P

[56] References Cited

U.S. PATENT DOCUMENTS

| | | | |
|---|---|---|---|
| Re. 31,114 | 12/1982 | Berg | 339/17 CF |
| 3,335,327 | 8/1967 | Damon et al. | 339/17 CF |
| 3,409,861 | 11/1968 | Barnes et al. | 339/17 CF |
| 3,708,779 | 1/1973 | Enright et al. | 339/99 R |
| 3,721,941 | 3/1973 | Wisser | 339/17 CF |
| 4,084,869 | 4/1978 | Yen | 339/17 CF |

*Primary Examiner*—Joseph H. McGlynn

*Assistant Examiner*—Gary F. Paumen

*Attorney, Agent, or Firm*—Donald M. Boles

[57] ABSTRACT

A polarized ribbon cable connector which facilitates the placement of electrical or circuit components therein is taught. Briefly stated, a housing lower assembly is profiled to receive a carrier strip therein. The carrier strip has bent up portions which provide for insulation displacement connection with electrical wires. An intermediate assembly is disposed on top of the carrier strip with a channel therein to receive a ribbon cable. A housing top assembly is disposed on top of the ribbon cable and has latches which mate with tabs contained on the lower assembly thereby interlocking various components together. The carrier strip also has contact legs disposed therein which allow for electrical contact to be made with pads contained in an insertable logic package. Knockout pin apertures disposed in the lower assembly allow portions of the carrier strip to be electrically isolated from the contact legs. Additionally, response/command pin apertures are also disposed in the lower assembly which thereby allow response/command plugs having pins therein to mate with the lower assembly whereby the pins contained in the plugs contact different portions of the carrier strip.

9 Claims, 15 Drawing Figures

FIG. 8
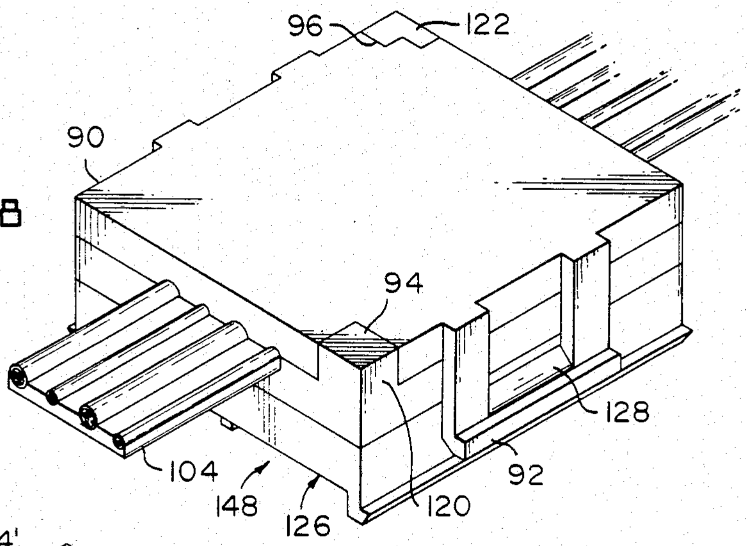
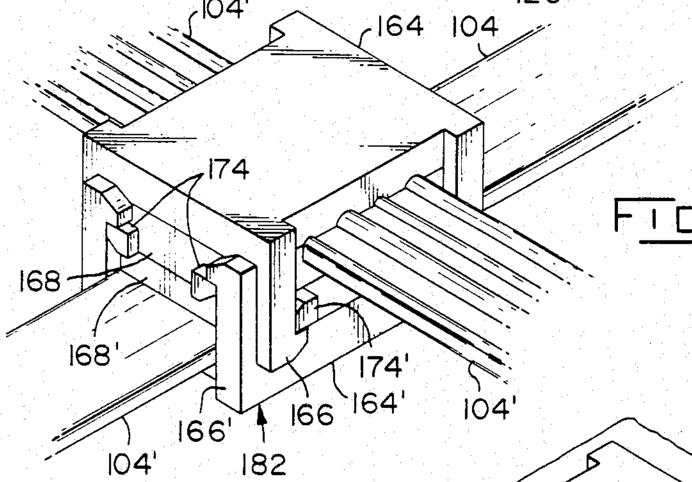
FIG. 12
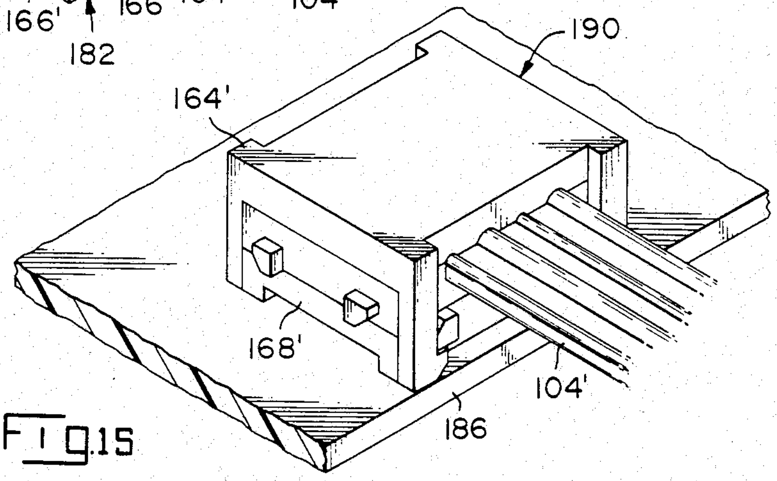
FIG. 15

POLARIZED RIBBON CABLE CONNECTOR HAVING CIRCUIT COMPONENTS THEREIN

CROSS-REFERENCE TO RELATED APPLICATIONS

The present invention is related to material disclosed in the following concurrently filed, copending U.S. patent applications, all of which are assigned to the same assignee as the present invention.

Ser. No. 567,476, "A Time Slot Addressed, System Keyed Multiplex Device" (AMP No. 09956), filed Jan. 3, 1984 by P. S. Chang and E. P. Dowling;

Ser. No. 567,459, "Active Connector", filed Jan. 3, 1984 by E. Dowling;

Ser. No. 567,478, "Polarized Ribbon Cable Connector",filed Jan. 3, 1984 by J. Fortuna; and Ser. No. 567,477, "Polarized Ribbon Cable Connector", filed Jan. 3, 1984 by J. Fortuna.

BACKGROUND OF THE INVENTION

This invention relates, generally, to a multiplex system and more particularly to a time-slot addressed form of multiplexing for controlling input and output signals for various types of electrical devices.

Initially as well as in the present, classical wiring methods involved point to point wiring. However with the ongoing desire for increased production coupled with increased labor and operating costs, wire harnesses or assemblies are being used with greater frequency. Classical methods of such assemblies involved the fabrication and installation of point to point designated wire harness assemblies, terminated as necessary with compatible connectors and contacts or terminals. This still continues to be the predominant practice with only now automatic harness manufacturing coming into its own. This automated harness manufacturing does help to lower the cost involved therewith, but still results in hidden costs such as harness boards which must be maintained and stored for future use as well as tested harness assemblies. Further, such multiple wire, premade harness assemblies do remain typically difficult to install into electromechanical system assemblies, due to their size in relation to the required dressing for fitting amongst the apparatus such as motors contained in a piece of machinery. Further, such harness wiring techniques are not intrinsically modular but are rather fixed in nature, making new feature options or add-ons difficult.

With the introduction of microcomputer controlled technology into electromechanical systems, some economies were realized in the area where buss technology has been employed. However, the utilization of buss technology has generally required the utilization of some form of hand shaking, that is the recognition by the controlled device of the address sent by the microcomputer which is unique to the particular recognition device. Further, this type of technology generally utilizes ribbons of parallel conductors requiring a multitude of wires for signals such as address, command, resets, interrupts, power, grounds and timing. Additionally, such ribbon or buss type technologies which loop around electromechanical systems are susceptible to electrical noise being induced which may require the use of sophisticated and extensive error detection and/or correction techniques.

A number of discrete attempts have been made at different aspects of bus technology such as may be found in U.S. Pat. Nos. 4,293,177 "Flat Cable Connector" issued Oct. 6, 1981, to Weisenburger; 4,209,219 "Method and Apparatus for Terminating Multi-Conductor Cable" issued June 24, 1980, to Proietto; 4,206,962 "Data/Logic Connector" issued June 10, 1980, to Shue, Jr., et al; 4,160,573 "Flat Cable Connector" issued July 10, 1979, to Weisenburger; 4,113,341 "Electrical Connector Having Provision for Circuit Components" issued Sept. 12, 1978 to Hughes; 4,062,616 "Flat Flexible Cable Connector Assembly Including Insulation Piercing Contacts" issued Dec. 13, 1977, to Shaffer et al; 4,005,518 "Apparatus for Connecting Conductors in Flat Cable to Terminals in a Connector" issued Feb. 1, 1977, to Bakermans; and 3,879,099 "Flat Flexible Cable Connector Assembly Including Insulation Piercing Contacts" issued Apr. 22, 1975, to Shaffer. One attempt has been made, however, to begin to utilize buss technology in an electromechanical environment, a description of which can be found in U.S. Pat. No. 4,370,561 "Vehicle Multiplex System" issued Jan. 25, 1983, to Briggs.

However, systems such as this or devices such as those found in the mentioned patents are generally unsuitable for systems outside of their original field of intended use.

Accordingly, it is desirable to have a device or system which allows for bi-directionality, that is commands out, responses back, offers the potential of utilization with few conductors on which instructions and responses are sent while minimizing the amount of wire and the number of positions per connector and incorporates some of the standardized interconnection techniques such as those which are used in buss wiring. Further, it is desirable to have a system that is directly compatible with microcomputer hardware/software, which is capable of being fully and completely fabricatable on automatic machinery, is simple, relatively easy as well as inexpensive to manufacture and utilize, compatible with switching high or low voltage/power while providing transponding status, and which is also compatible with a variety of sensors for providing the status for such transponders. Additionally, it is desirable to have a device which is relatively immune to electrical interference. Such a device is taught by the present invention.

Accordingly, it is also desirable to have a device which teaches and as an object of the invention a cable connector having circuit components therein, comprising a housing top assembly having a profiled area to receive an electrical cable and having at least two latch members attached thereto, an electrical cable having a plurality of wires therein disposed adjacent to the profiled area, a housing intermediate assembly adjacent the top assembly having a cable receiving channel therein, the channel in opposing relationship to the profile area in the top assembly and having contact receiving apertures therethrough, a logic package having electrical components contained therein and conductive pads disposed on the outside thereof wherein the pads are electrically connected to the components, a connector carrier strip adjacent to the intermediate assembly, the strip being characterized in that it has a plurality of terminals bent up from the plane defined by the strip, the terminals cooperating with the apertures in the intermediate assembly and extending therethrough so as to have each of the terminals engage a wire in the cable, further characterized in that a plurality of contact legs are bent down from the plane defined by the strip, the legs facilitating electrical communication with the logic package and being further characterized in that pin apertures are disposed in the strip which allow for electrically conductive pins to be disposed therethrough and thereby in electrical communication with the logic package and/or the wires in the cable, and a housing lower assembly adjacent to the strip and which is profiled to receive the strip, having a lower assembly aperture therein profiled to receive the contact legs and the logic package, the lower assembly having lower assembly pin apertures therethrough which are aligned and cooperate with the pin apertures in the strip and the electrically conductive pins and further having retaining tabs cooperable with the latch members contained on the top assembly thereby fixedly holding the upper, intermediate and lower assemblies along with the strip and the cable together thereby forming an active connector assembly.

BRIEF DESCRIPTION OF THE DRAWINGS

FIG. 8 is an assembled perspective view of the connector of FIG. 6;

FIG. 12 is an isometric view of the connector of FIG. 10 in assembled condition;

FIG. 15 is an assembled isometric view of the connector shown in FIG. 13.

DESCRIPTION OF THE PREFERRED EMBODIMENT CONSTRUCTION OF THE SYSTEM

Figure 1:
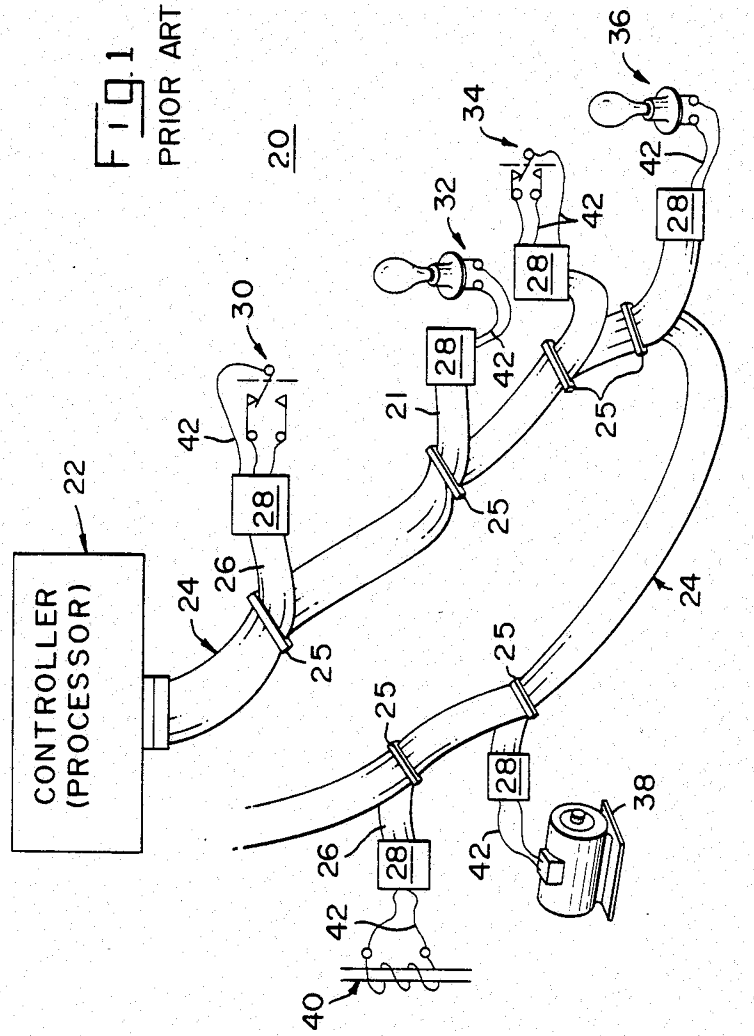
Fig. 1 PRIOR ART
FIG. 1 is an illustration of the prior art using buss technology with the utilization of ribbon cables and input/output modules.

Reference is now made to FIG. 1 which is a representative diagram of the buss type technology utilized with the prior art. Here there is shown a command and control system 20 which uses present day or standard bus technology approaches and therefore only a brief description will be made below. Generally, a controller or microcomputer/processor 22 is connected to a ribbon cable or harness 24. The controller 22 generally utilizes a parallel output or a number of discrete wires whereby each wire represents a circuit path. A connector 25 is used to tap into the harness 24 thereby providing a leg 26 which is then connected to an interface card 28. Generally the interface cards 28 require local power for processing the signals which are carried over the harness 24. The interface cards 28 form a plurality of I/O functions such as switch A or load A 30, 32 or switch B or load B 34, 36. Additionally, a motor 38 may also be monitored for rpm, phase loss, etc. while solenoids or valves 40 may also be controlled. Control/sensing wires 42 are generally utilized to connect sensors to the various loads and/or devices to the interface unit 28. It has been found that this type of system generally utilizes a protocol system between the controller 22 and the interface cards 28 for prioritizing and controlling communications between the different interface cards 28 and the controller 22. It has also been found that this of similar types of systems generally are subject to interference and are bulky or space consuming as well.

Figure 2:
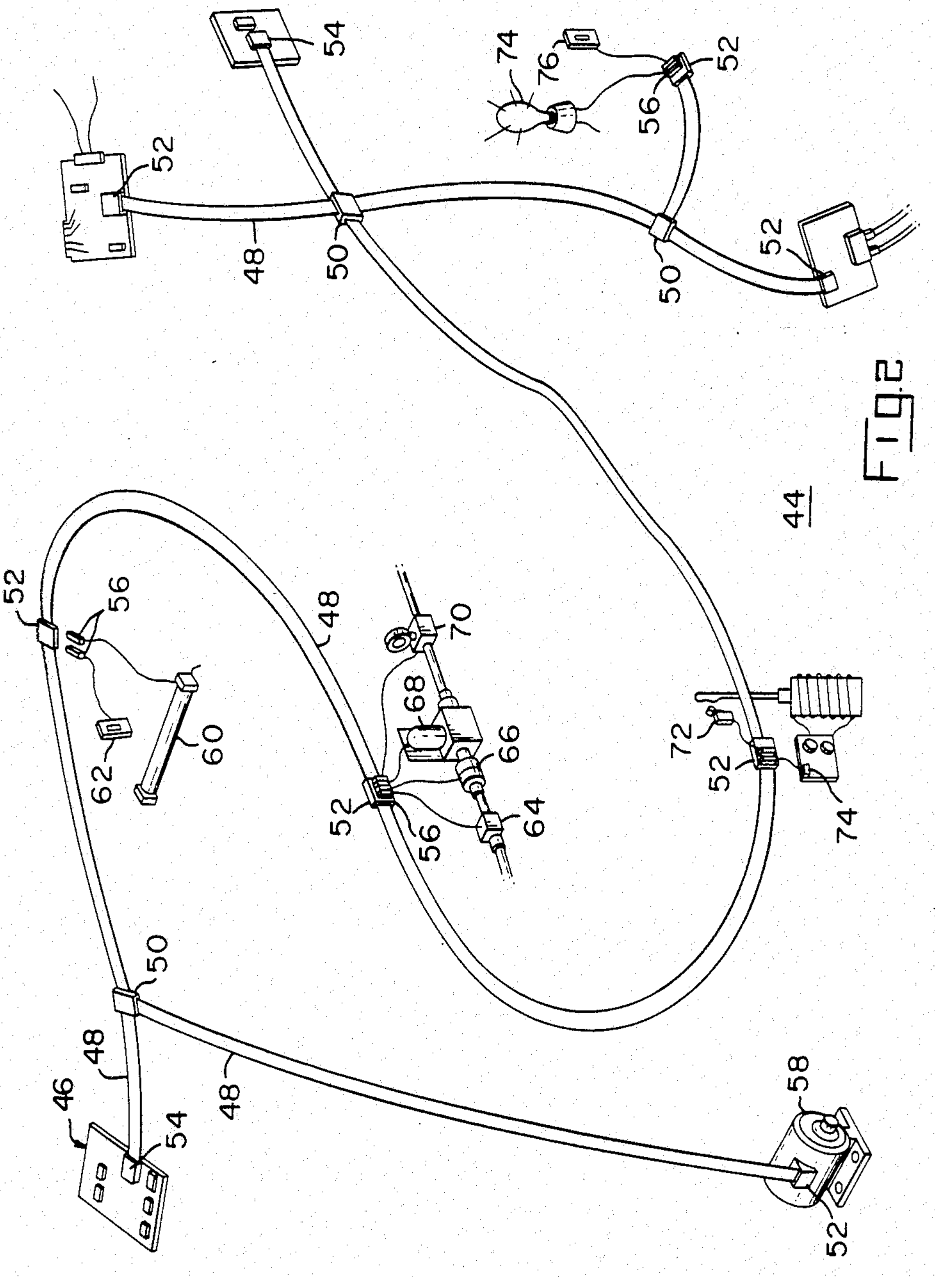
FIG. 2 is an illustration of the system as envisaged by the present device.

Referring now to FIG. 2 there is shown an illustration of the system as envisaged by the present invention. Here, a time-slot addressed system keyed multiplexed system (TASK) shown generally at 44 is illustrated. A controller 46 which may be a microprocessor or a computer as well as a port or interface point with a larger computer system essentially "drives" or directs the multiplex system, the basic operation of which is old in the art. The ribbon cable 48 in the preferred embodiment of the present invention has four conductors. These conductors are for power, ground, clock signal and timing, although it is to be understood that more conductors may be utilized without departing from the spirit and scope of the present invention or fiberoptics may be utilized. The power and ground conductors provide electrical power to the active connectors 52 thereby removing the necessity for power of the active connectors 52 at remote locations. The timing conductor provides a timing signal for the active connectors 52 for control purposes and will be described more fully below while the data conductor provides a data path to individual active connectors 52 from the controller 46 or responses from the active connectors 52 to the controller 46. A number of devices or connectors are attached to the cable 48 at different points where control or monitoring of various devices is desired. An "X"- or "T"-type connector is utilized to tap the ribbon cable 48 for going in two directions. An active connector 52 is placed onto the cable 48 at any point where control or monitoring is desired while an "E" (end) or terminating connector 54 is utilized at the end of the bus for terminating bus impedence purposes as well as for attachment to printed circuit board in some applications. Response/command connector plugs with wires 56 are utilized in conjunction with the active connectors 52 to provide an electrical path for command or response situations. Further, various devices or loads may be utilized in conjunction with the task system 44 such as a motor load 48, light 60, photosensor 62, flowsensor 64, temperature sensor 66, shut off valve 68, pressure gauge 70, position switch 72, coil control 74 and an on/off control switch 76. It is to be understood, however, that the above devices 58 through 76 are exemplary only and are not to be construed as limiting the scope of applications.

Figure 3:
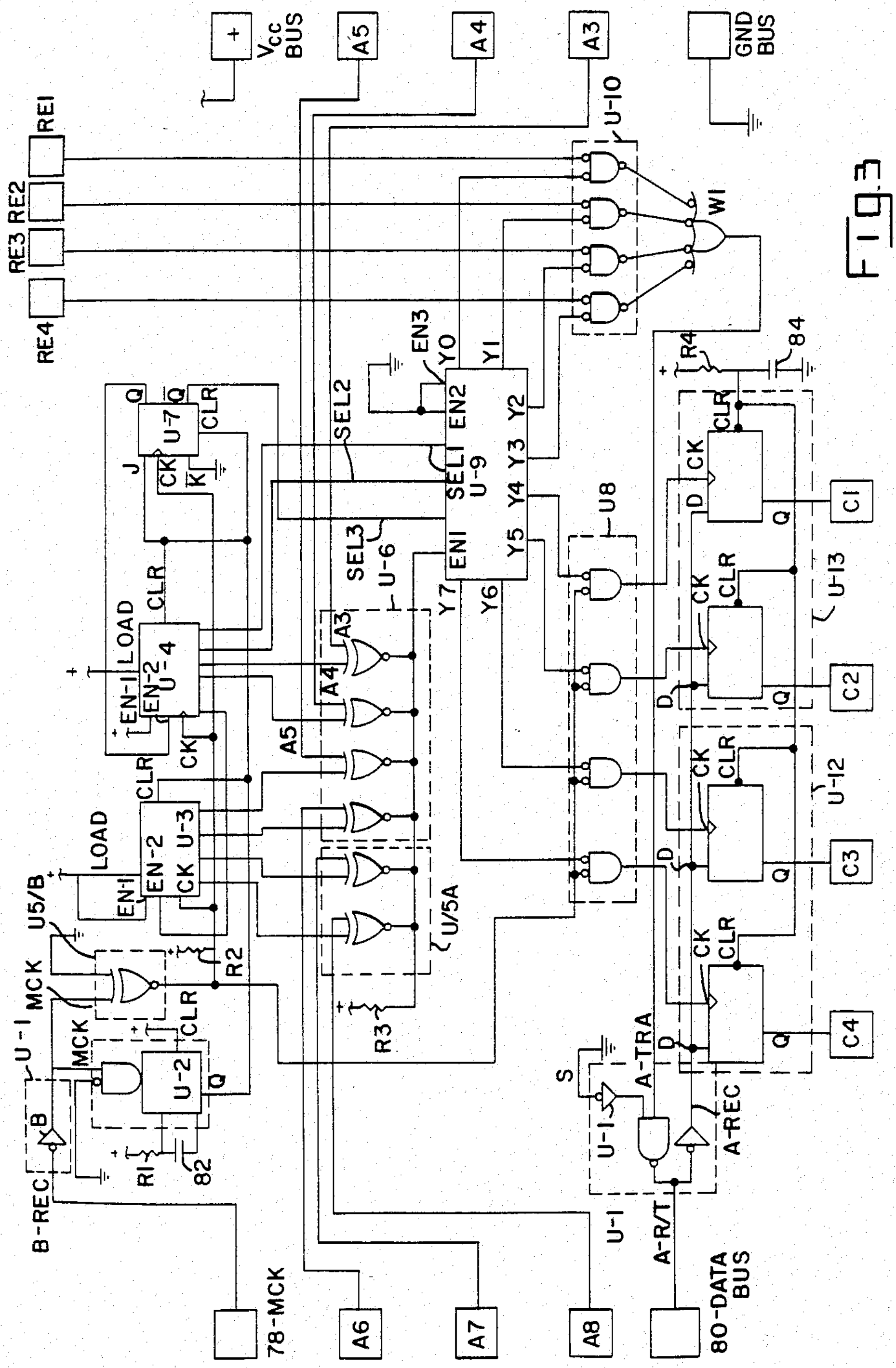
FIG. 3 is a schematic diagram of the logic circuitry utilized with the present device.

Referring now to FIG. 3 there is shown a schematic diagram of the logic circuitry utilized with the active connector of the present system. It should be noted that the preferred embodiment of the present system the circuitry embodied in FIG. 3 is on a chip level and is placed into a package for use within a connector housing (described more fully below). The circuitry is connected at four places to the cable. These places are the ground, positive power $v_{cc}$ the master clock (MCK) 78 and data 80. Address lines A3 through A8 are utilized for providing an address to be recognized by the circuitry. Command lines C1, C2, C3 and C4 provide output from the logic circuitry to various load or load controlling devices while response lines RE1, RE2, RE3 and RE4 provide an input means to the logic circuitry from sensors or monitoring devices. For simplicity purposes a number of functions have been divided or shown in block form, the titles of which are listed in Table 1 below.

TABLE I

| Device Number | Function |
|---|---|
| U-1 | Line Transceiver |
| U-2 | Monostable Multivibrator |
| U-3 | Synchronous 4-Bit-Counter |
| U-4 | Synchronous 4-Bit-Counter |
| U-5/A | Exclusive-NOR Gates |
| U-5/B | Exclusive-NOR Gates |
| U-6 | Exclusive-NOR Gates |
| U-7 | J-K Flip-Flop |
| U-8 | Quadruple 2-Input-NOR Gate |
| U-9 | 3 Line to 8 Line Decoder |
| U-10 | Quadruple 2-Input OR Gate |
| U-11 | 4-Input NAND Gate |
| U-12 | Dual D-Type Flip-Flop |
| U-13 | Dual D-Type Flip-Flop |

The functioning of the devices in units U-1 through U-13 is well known, readily understood by one skilled in the art and is readily available on a discrete package basis. The data bus 80 is connected to the A-R/T (A-Receive/Transmit) terminal of line transceiver U-1 and is a receive/transmit signal for bi-directional communication on the data bus. The A-R/T is then internal to U-1 connected to the output of a dual input nand gate as well as to the input of the inverting amplifier A. The nand gate of U-1 has connected to one of its inputs, the output of an inverting amplifier. The input of the inverting amplifier S is connected to electrical ground provided by the ground bus. The remaining input of the nand gate of U-1 is the A-tra (transmit) terminal and which is connected to the output of a four-input nand gate U-11. The output of the inverting amplifier A is A-REC (receive) and is connected to each D output for units U-12 and U-13 which are dual D-type flip/flops. The Q outputs of the D-type flip/flops of units U-12 and U-13 are connected to the command terminals C-1 through C-4 in the order shown. The clear (CLR) terminals of the flip/flops contained in U-12 and U-13 are connected together and, thence, connected to one end of resistor R-4 and one terminal of timing capacitor B (84). The remaining end of resistor R-4 is tied to $V_{cc}$ while the remaining terminal of timing capacitor B (84) is connected to the ground bus. The resistor/capacitor combination of R-4, 84 provides a timing function. It is to be understood, however, that this timing function may be comprised of different devices such as an R/C oscillator of a very short time constant coupled with a counter, thereby providing the proper timing values. The clock (CK) terminals of the flip/flops contained in U-12 and U-13 are individually connected to the outputs of the nor gates contained in U-8 which is a quadruple two-input nor gate. One of the input terminals from each of the nor gates in unit U-8 is tied together and thence to the output terminal of exclusive nor gate U-5/B, clock terminals (CK) of units U-3 and U-4 which are synchronus four-bit counters and to the clock input (CK) of unit U-7 which is a J-$\overline{K}$ flip-flop. Also tied to these clock (CK) inputs is one end of resistor R-2 with the remaining end of resistor R-2 connected to the $V_{cc}$ bus. Each of the remaining input terminals of the nor gates of U-8 are connected to output terminals $Y_4$, $Y_5$, $Y_6$ and $Y_7$ of U-9, a three line to eight line decoder such that $Y_4$ is connected to the nor gate of U-8 associated with C-1 with $Y_5$, $Y_6$ and $Y_7$ being similarly connected with command terminals C-2, C-3 and C-4 respectively. The output terminals $Y_0$, $Y_1$, $Y_2$ and $Y_3$ of U-9 are each consecutively connected to one input of the four gates for unit U-10, a quadruple 2-input OR gate. The remaining inputs of the OR gates of U-10 are connected to response terminals RE-1, RE-2, RE-3 and RE-4 such that the $Y_3$ output terminal of U-9 is connected to the same OR gate as response terminal RE-4 with $Y_2$, $Y_1$ and $Y_0$ similarly connected to the respective gates associated with RE-3, RE-2 and RE-1. The outputs of the OR gates contained in U-10 are connected to the input terminals of the four-input nand gate U-11. Two of the enable terminals EN-2 and EN-3 of decoder U-9 are connected to the ground bus while the enable terminal EN-1 is connected to all of the output terminals of the exclusive nor gates of U-6 as well as to the output terminals of the exclusive nor gates of U-5/A and one end or resistor R-3. The remaining terminal of resistor R-3 is connected to the $V_{cc}$ or power bus. The select terminals SEL-1 and SEL-2 of the decoder U-9 are connected to output terminals $O_A$ and $O_B$ of the synchronous four bit counter U-4. Select terminal SEL-3 is connected to the $\underline{Q}$ terminal of U-7, a J-$\overline{K}$ flip-flop. One input terminal of each of the nor gates of U-6 is connected to the address terminals $A_3$, $A_4$, $A_5$ and $A_6$ individually while similarly one input terminal of U-5/A is connected to $A_7$ and $A_8$. The remaining input terminals of the nor gates in U-6 and U-5/A are connected to outputs $O_C$ and $O_D$ as well as $O_A$, $O_B$, $O_C$ and $O_D$ of synchronous four bit counters U-3 and U-4 such that $O_C$ and $O_D$ of U-4 are connected to the inputs of the nor gates of U-6 associated with address terminals $A_3$ and $A_4$ respectively while $O_A$, $O_B$, $O_C$ and $O_D$ of U-3 are connected to the input of the gates associated with $A_5$, $A_6$, $A_7$ and $A_8$ respectively. The load terminals of four bit counters U-3 and U-4 are tied to the power bus $V_{cc}$, while the load terminal of U-3 is also connected to an enable line EN-1 of U-3. The remaining enable terminal EN-2 of U-3 is connected to the ripple terminal (RPL) of U-4. Enable terminal EN-1 of U-4 is connected to $V_{cc}$ while the second enable terminal EN-2 of U-4 is connected to the Q terminal of J-$\overline{K}$ flip-flop U-7. The clear (CLR) terminals of U-3 and U-4 are connected together and also to the CLR and J terminal of U-7 as well as to the Q terminal of U-2. The $\underline{K}$ terminal of U-7 is connected to the ground bus. One input of an exclusive nor gate in U-5/B is connected to the ground bus with the remaining input connected to one input terminal of the nand gate of U-2 and to the output of the inverting buffer amplifier of U-1, thereby defining a not-master clock signal $\underline{MCK}$. The input to the inverting amplifier of U-1 (B-receive) is connected to the master clock (MCK) bus, 78. The remaining input to the nand gate of the monostable multivibrator U-2 is connected to ground. A timing capacitor 82 is connected across the $C_{ext}$ terminals of the monostable multivibrator U-2 with one terminal of the capacitor connected to one end of resistor R-1 and the remaining end of resistor R-1 tied to $V_{cc}$.

Figure 5:
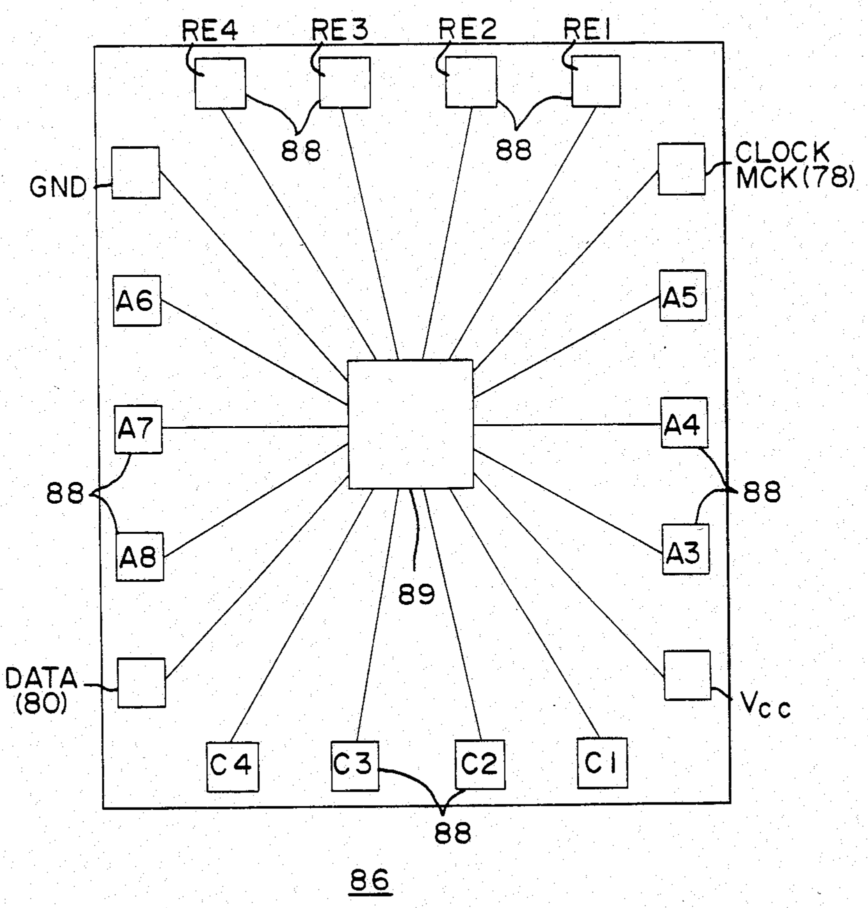
FIG. 5 is a pin out diagram of the semiconductor chip to be utilized by the present device.

Referring now to FIG. 5 there is shown a pin-out diagram of the semiconductor chip to be utilized by the present invention. Here it can be seen that the logic chip 89 utilizes an 18 pin pin-out arrangement, although it is to be understood that fewer or more pins may be utilized. The pin assignment 86 utilizes conductive pads shown generally at 88 for connection of the logic chip 89 with external circuitry. The chip 89 has four response leads RE-1 RE-2, RE-3 and RE-4, four command leads C-1, C-2, C-3 and C-4 and six address leads $A_3$, $A_4$, $A_5$, $A_6$, $A_7$ and A-8. Additionally, a ground and a $V_{cc}$ (power) terminal, a data terminal 80 and a master clock (MCK) terminal 78 are utilized.

Figure 6:
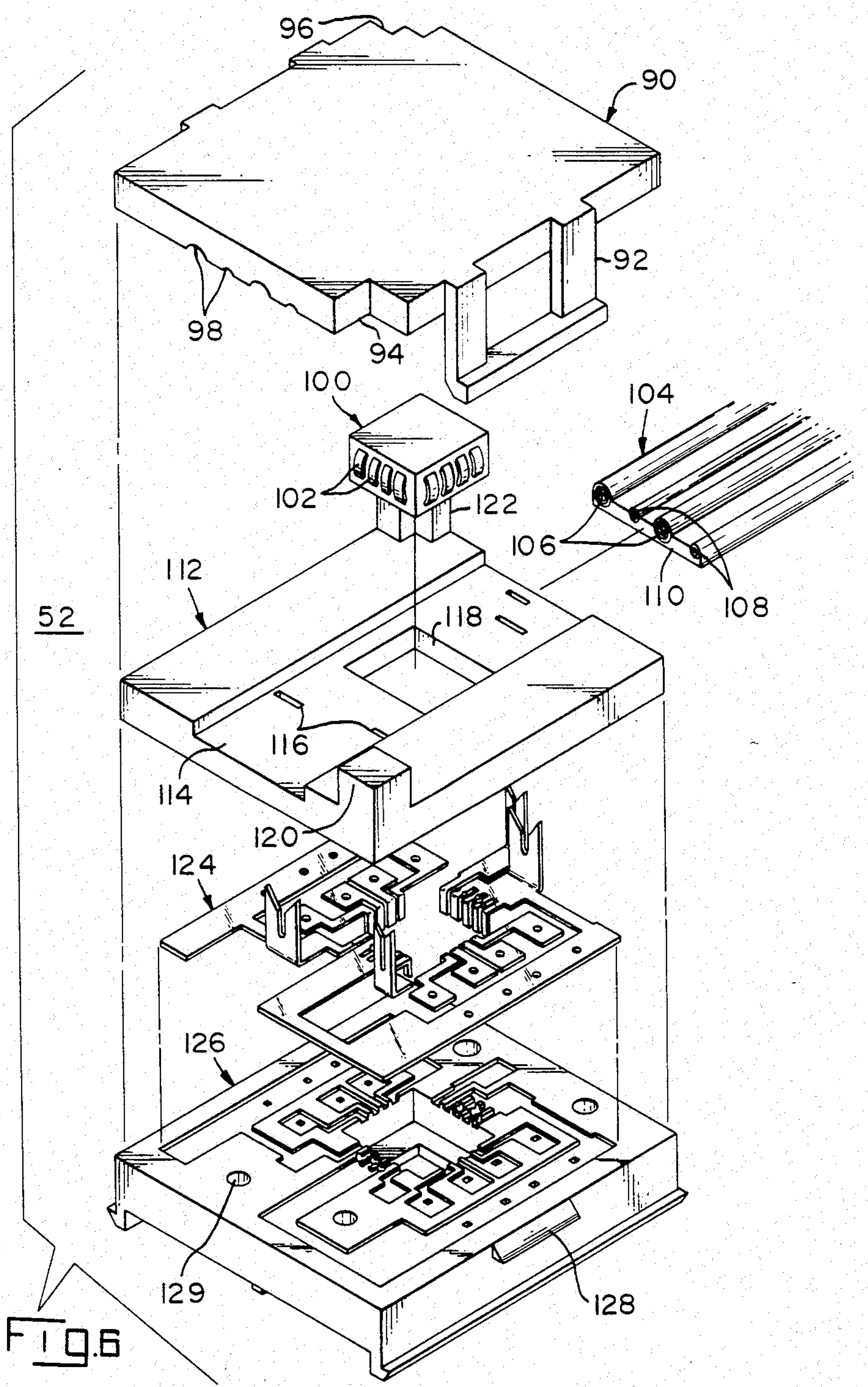
FIG. 6 is an exploded perspective view of an active connector.

Referring now to FIG. 6 an exploded view of an active connector as utilized by the present system is shown. The active connector 52 is comprised of an active connector housing top assembly 90 having retaining latches 92 thereon. Disposed diagonally across from each other are polarizing indentations A and B 94, 96 respectively. The top housing 90 has ribbon cable polarizing grooves or channels 98 disposed therein for centering and rigidly retaining a polarized ribbon cable 104. A logic package 100 having conductive pads 102 thereon is utilized with the active connector and has contained therein the logic chip having the logic circuitry of FIG. 3 and the pin-out presentation as described in FIG. 5. The polarized ribbon cable 104 has two large diameter power conductors 106 and two smaller diameter signal conductors 108 which are disposed in a ribbon cable carrier material 110. This material is in the preferred embodiment of the present system an extruded plastic, although it is to be understood that other types of ribbon cabling may be utilized. An active connector housing intermediate assembly 112 is utilized and which has contained therein a cable receiving channel 114 for receipt of the polarized ribbon cable 104. Disposed in the intermediate assembly 112 are insulation displacement contact receiving apertures 116 which are utilized in conjunction with the active connector carrier strip 124, described more fully below. An intermediate housing aperture 118 is disposed in the center of the intermediate assembly 112 while polarizing tabs A and B 120, 122 respectively are disposed thereon also. An active connector carrier strip 124 provides a circuit path structure for interconnection with the conductors contained in the ribbon cable 104 as well as the conductive pads 102 contained on the logic package 100. An active connector housing lower assembly 126 is provided and has disposed thereon retaining tabs 128 which are engageable with the retaining latches 92. Locating pin apertures 129 are disposed in the lower assembly 126 which are profiled to receive pins located on the underside of the intermediate assembly 112 (not shown).

Figure 7:
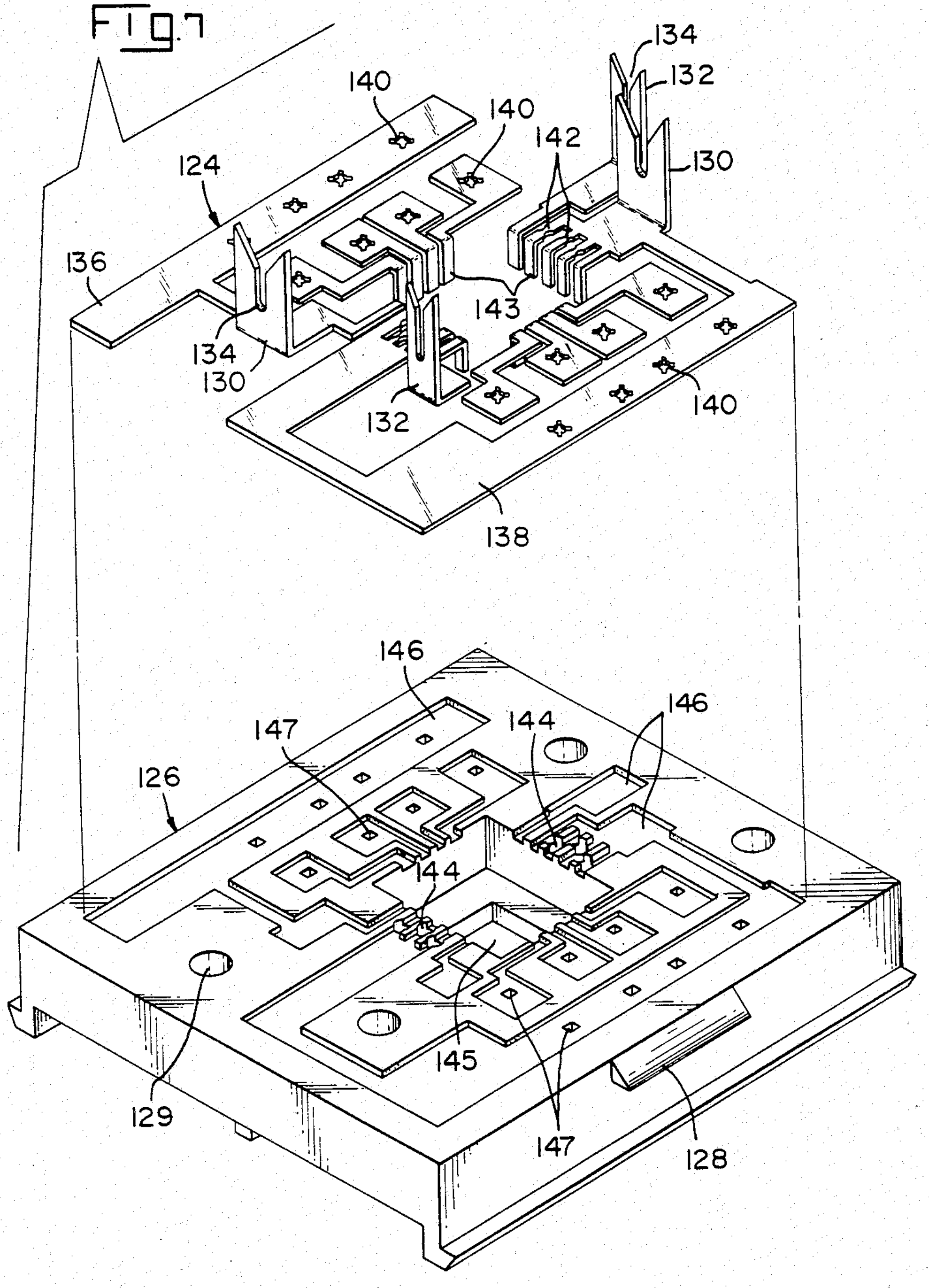
FIG. 7 is an enlarged view of a portion of FIG. 6.

Referring now to FIG. 7, an enlarged view of a portion of FIG. 6 is shown. The carrier strip 124 in the preferred embodiment of the present system is stamped out of a singular piece of beryllium copper and then formed for usage with the present invention. The carrier strip 124 has power conductor terminals 130 and signal conductor terminals 132 stamped and formed therefrom. Disposed in the power and signal conductor terminals 130, 132 are insulation displacement areas 134 which are used to rigidly hold the ribbon cable in place (not shown) and to make contact with the appropriate electrical conductors, their use of which is well known in the art. A conductor strip ground 136 and a conductor strip power area 138 is provided each having pin apertures 140 which are utilized in conjunction with response or command signals. Disposed adjacent to the power and signal conductor terminals 130, 132 are address pin knock out regions 142. It is to be understood that although the carrier strip 124 is shown with all portions bent and separated as shown, this is done for simplicity or illustration purposes only. In the preferred embodiment of the present system the carrier strip 124 would be stamped having the power and signal conductor terminals 130, 132 bent up as shown but having the contact legs shown generally at 143 in a non-bent position parallel to the planar disposition of the carrier strip 124 and connected by a piece of carrier strip material which would not have been punched out yet. The carrier strip 124 is then inserted into the lower assembly 126 wherein a punch and die operation is performed to remove the center portion of the strip which joins the contact legs 143. Further shown in more detail is the lower assembly 126 which houses the carrier strip 124. Disposed in the lower assembly 126 are knock-out pin apertures 144 which are in alignment with the address pin knock out regions 142. The lower assembly 126 has a lower assembly aperture 145 which is used for the punch and die operation mentioned previously. Inset or recessed into the lower assembly 126 are carrier strip recesses 146 such that upon mounting the carrier strip 124 into the lower assembly 126 a smooth contiguous surface is presented with the exception of the power or signal conductor terminals 130, 132. The carrier strip recesses 146 have disposed therein lower assembly response/command pin apertures 147 which coincide with the response/command pin apertures 140 disposed in the carrier strip 124. Therefore, upon placing the carrier strip 124 into the recesses 146 of the lower assembly 126 the intermediate assembly 112 is placed on top of the carrier strip 124. Locating pins (not shown) disposed on the underside of the intermediate assembly 112 mate with the locating pin apertures 129 with the pins then collapsed or pressed in place so as to expand in the apertures 129 thereby rigidly holding the intermediate assembly to the lower assembly 112, 126. The logic package 100 is then inserted into the intermediate housing aperture 118 and in the preferred embodiment of the present invention is fixedly held in place by a sealant/adhesive.

Referring now to FIG. 8 an entire active connector assembly 148 is shown. Here it can be seen how the retaining latches 92 engage the retaining tabs 128 thereby holding the top assembly 90 tightly to the lower assembly 126. Further evident is how the polarizing tabs A and B 120, 122 mate with the polarizing indentations A and B 94, 96. Also shown is the ribbon cable 104 in its fully mated position in the assembly 148.

Figure 9:
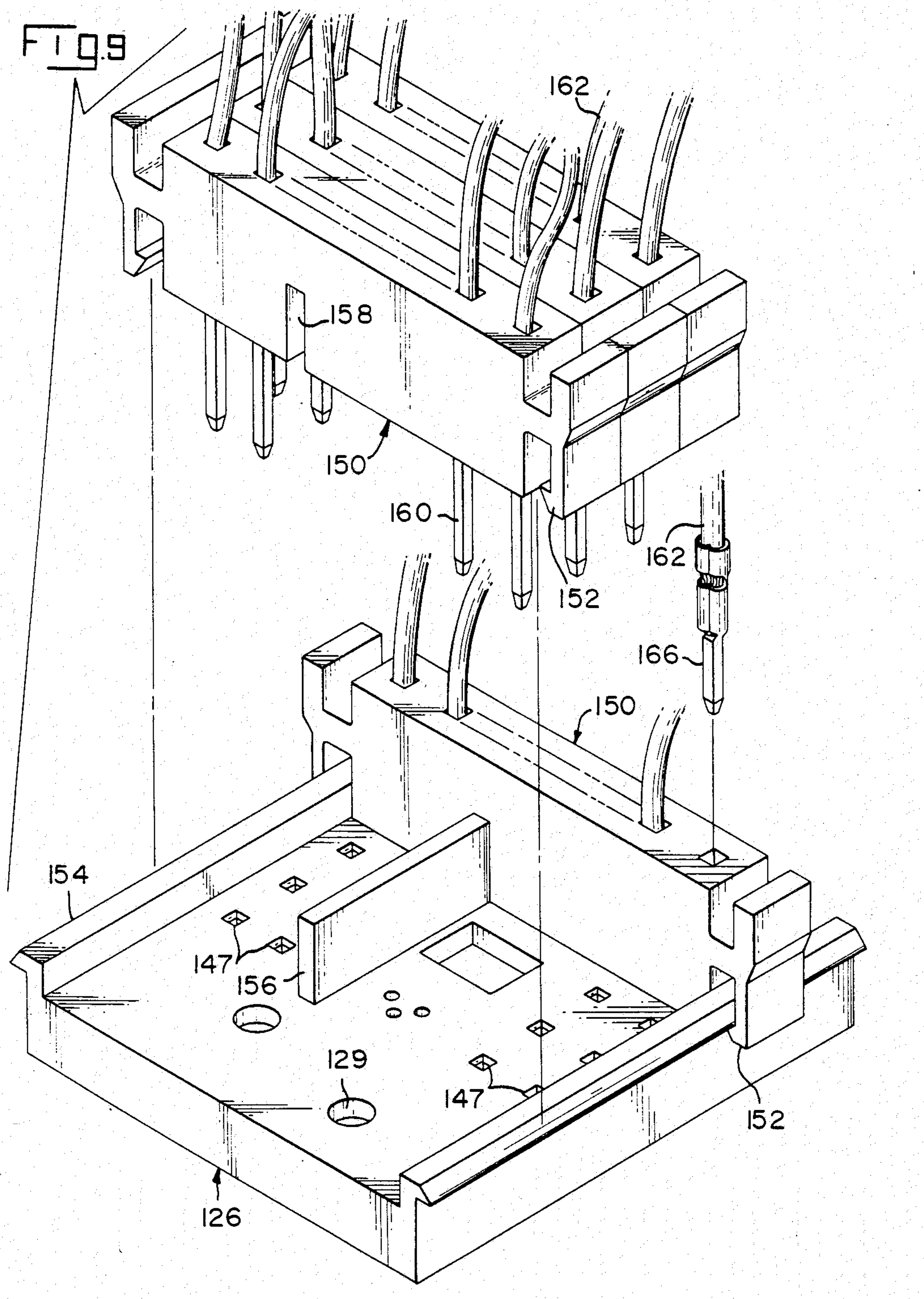
FIG. 9 is an isometric view of the underside of the active connector of FIG. 6 utilizing input/output pins.

Referring now to FIG. 9 there is shown the underside of the active connector of FIGS. 6, 7 and 8. Here the lower assembly 126 mates with a response/command plug, shown generally at 150. The response/command plug 150 has response/command plug latches 152 disposed thereon which engage the response/command plug tabs 154 disposed on the lower assembly 126. A polarizing bar 156 engages the plug polarizing groove 158 contained on the plug 150. Disposed in the plug 150, are pins 160 having response/command wires 162 attached thereto with the pins 160 rigidly held in place in the plugs 150. The pins 160 engage the lower assembly response/command pin apertures 147 and thereafter would engage the response/command pin apertures 140 contained in the active connector carrier strip 124 (not shown). Also disposed in the lower assembly 126 are the knock out pin apertures 144 as mentioned previously. The locating pin apertures 129 enable the intermediate assembly 112 to be fixedly secured to the lower assembly 126. Due to the handle-like formation of the response/command plug latches 152 it is readily evident that the response/command plugs 150 are readily removable.

Figure 10:
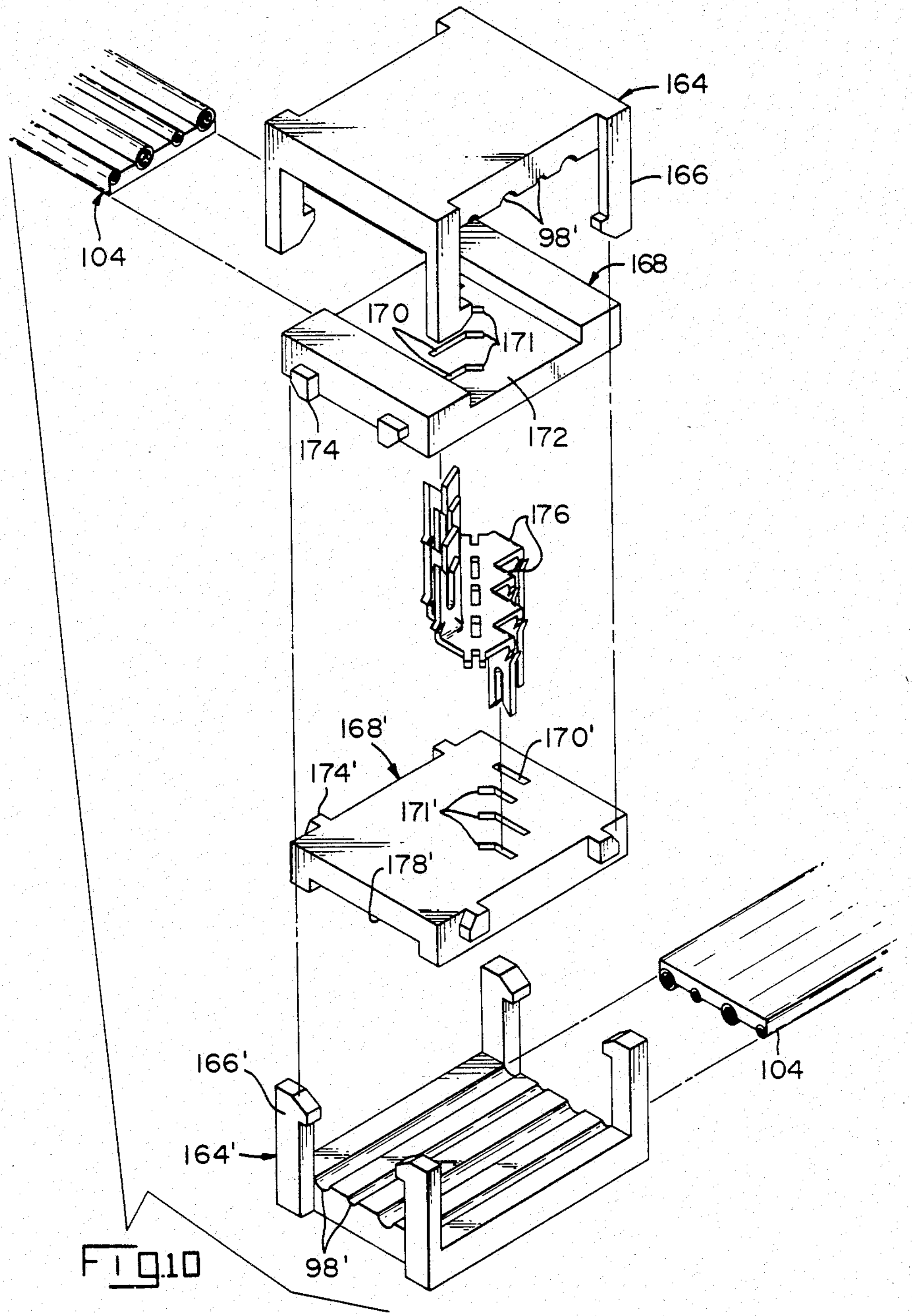
FIG. 10 is an exploded isometric view of an "X- or T-type" connector for the interconnection of ribbon cable as utilized by the present device.

Referring now to FIG. 10 there is shown an exploded isometric view of an "X"- or "T"-type connector for the interconnection of ribbon cable as utilized by the present system. It is to be remembered that components similar in structural operation to previously described components will be identified by the previously assigned numberal with the addition of a prime ('). Here there is shown an X-connector outer assembly 164, 164' which has X-connector retaining latches 166, 166' attached thereto. Ribbon cable polarizing grooves 98' are disposed in the outer assemblies 164, 164'. X-connector inner assemblies 168, 168' are disposed between the outer assemblies 164, 164' and have X-connector insulation displacement contact apertures 170, 170' disposed therein. The inner assemblies 168, 168' have X-connector cable receiving panels 172, 172' disposed therein with inner assembly tabs 174, 174' disposed on the outside of the inner assemblies 168, 168'. Disposed between the inner assemblies 168, 168' are X-connector contacts 176.

Figure 11:
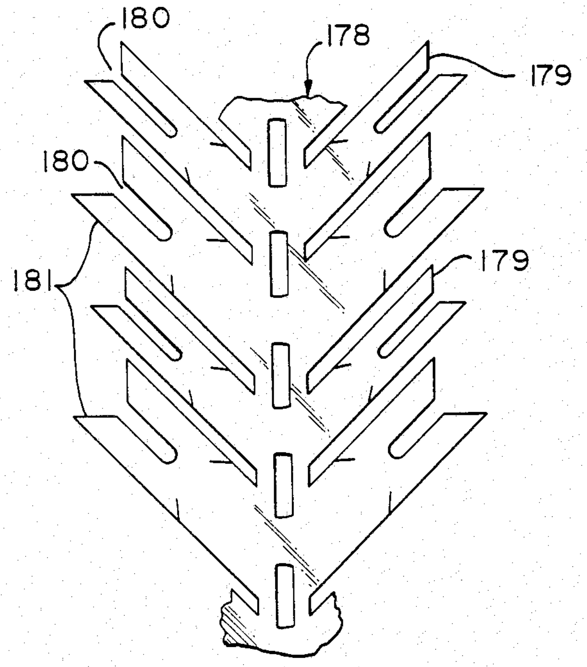
FIG. 11 is a plan view of the contacts of FIG. 10 after formation of the basic contact structure.

Referring now to FIG. 11 there is shown a plan view of the contacts of FIG. 10 after stamping but before forming. Here it can be seen that the X-connector contacts 176 are comprised of an X-connector contact strip 178 having X-connector signal terminals and X-connector power terminals 179, 181 respectively disposed thereon. Disposed in the signal and the power terminals 179, 181 are insulation displacement areas 180.

Referring now to FIG. 12 an isometric view of the connector of FIG. 10 in an assembled condition may be seen. Here the X-connector assembly 182 which is comprised of the outer assemblies 164, 164' and the inner assemblies 168, 168' are mated with the ribbon cable 104, 104'. Shown also is how the retaining latches 166, 166' engage with each other as well as the inner assembly tabs 174, 174' similarly mating with each other. In this configuration of an "X"-type arrangement, the ribbon cables 104, 104' crisscross each other thereby forming the "X". In the event that a "T"-type arrangement is desired the cable 104 or 104' would enter into the connector assembly 182 and would not extend therethrough.

Figure 13:
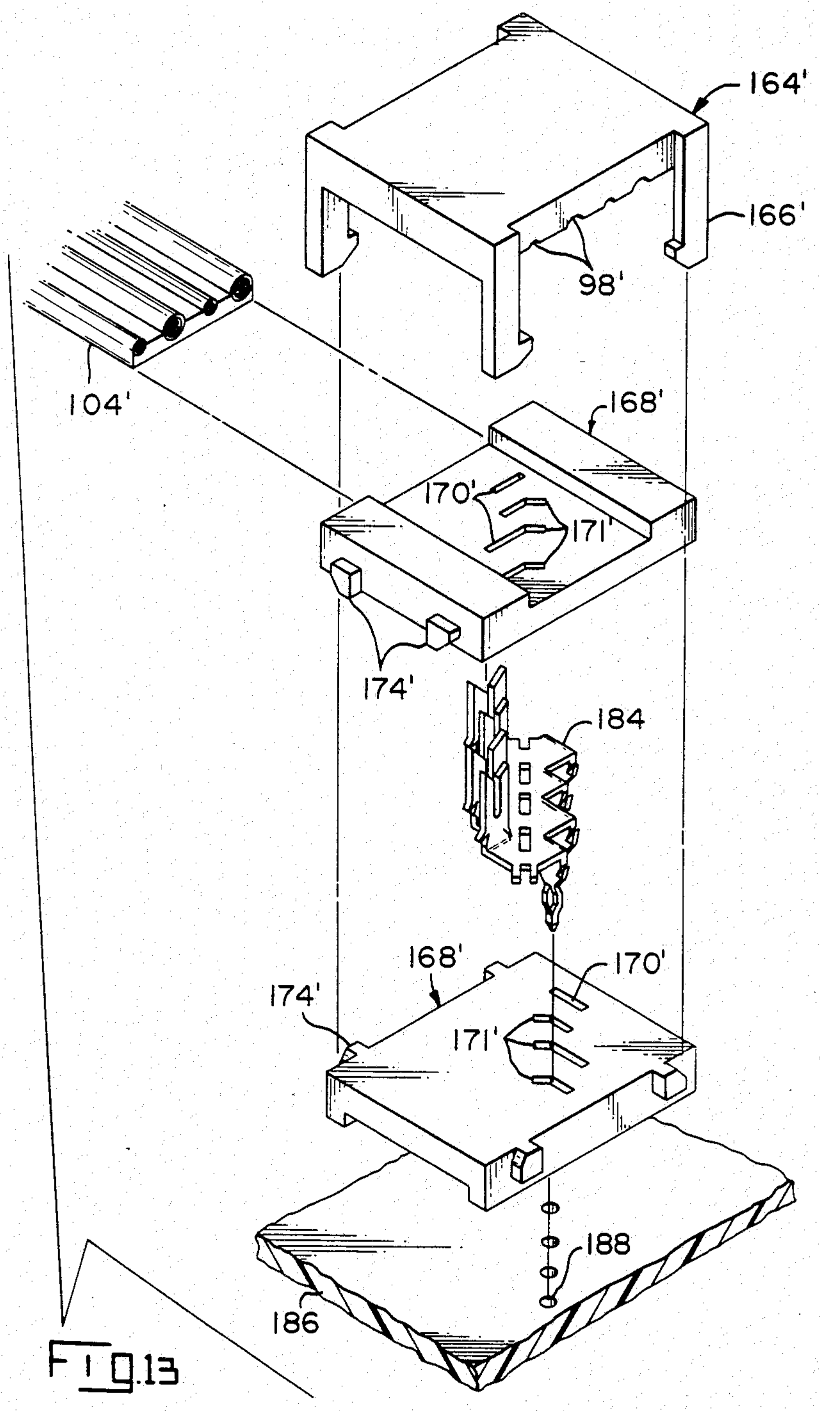
FIG. 13 is an exploded isometric view of an end or terminating connector which is utilized in conjunction with a printed circuit board.

Referring now to FIG. 13 an exploded isometric view of end or terminating connector (E) which is utilized in conjunction with a printed circuit board is shown. Here the structure of the connector and its usage is similar to the "X"-type arrangement as shown in FIGS. 10 and 12 with the distinction that one outer assembly 164' is utilized and end connector contacts 184 are used. Also utilized is a printed circuit board 186 having printed circuit board apertures 188 disposed therein. The printed circuit board may have a terminating resistor mounted thereon (not shown).

Figure 14:
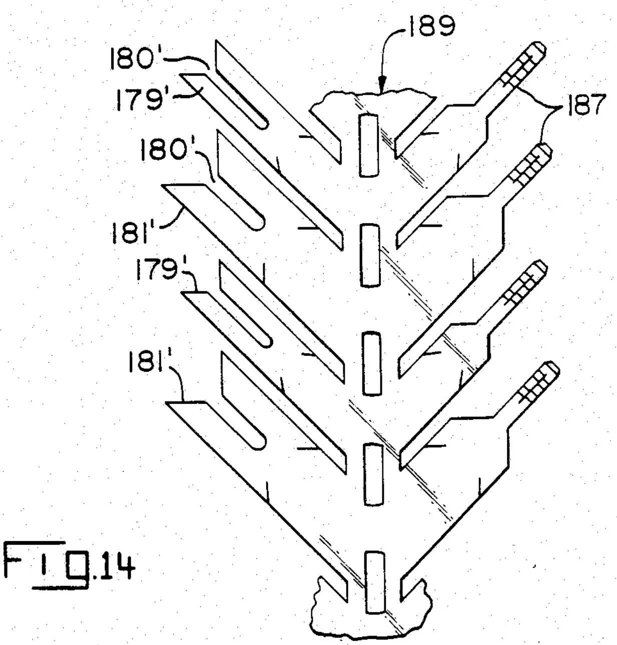
FIG. 14 is a plan view of the contacts of FIG. 13 after formation of the basic contact structure.

Referring now to FIG. 14 there is shown a plan view of the contacts of FIG. 13 after formation of the basic contact structure. Shown is an end connector contact strip 189 which has "X"-type connector signal terminals 179' as well as X-type connector power terminals 181', each having insulation displacing areas 180' disposed therein. Formed and stamped at the remaining ends of the signal and power terminals 179', 181' are wire wrap or contact terminating posts 187, which in the preferred embodiment of the present invention are compliant pin type terminals for securely affixing the terminating posts 187 in printed circuit board apertures.

Referring now to FIG. 15 an assembled isometric view of the connector shown in FIG. 13 is illustrated having an "E" (end) connector assembly 190 disposed on a printed circuit board 186. The assembly 190 is shown as having a portion of the ribbon cable 104' disposed therein with the outer assembly 164' and the inner assemblies 168, 168' shown in mated condition to each other and to the printed circuit board 186.

OPERATION AND INSTALLATION

Referring back to FIG. 2 an overview for utilization of the presented system may be obtained. It is to be understood, however, that the present device may be utilized in a variety of situations other than the one shown. These various situations may include photostat machines, assembly lines or automobiles. In this manner, electrical power to operate various devices such as lights, motors, compressors or the like is essentially run in parallel with the present TASK system 44 being a truly command and control system. Accordingly, the ribbon cable 48 is run through and around various components which are to be interconnected with the TASK system. Thereafter, the E connectors 54 and the X or T connectors 50 are placed onto the cable 48. The active connectors 52 are then placed adjacent various loads or where monitoring is required. At this point, the response command plugs 150 having response command connector plug wires 56 attached thereto are mated with the active connectors 52. These wires shown generally at 56 are then attached to the appropriate control or monitoring device. The attachment of the active connectors 52 to the cable 48 requires that the connectors be properly terminated as well as an address code be designated for each connector 52 which is to be described more fully below.

Referring now to FIGS. 6, 7, 8 and 9, mating of an active connector 52 to a cable 48 may be seen. In the preferred embodiment of the present system the logic package 100, active connector housing intermediate assembly 112, active connector carrier strip 124 and active connector housing lower assembly would be fully assembled prior to cable mating. The polarized ribbon cable 104 is comprised of two power conductors 106 and two signal conductors 108 which are disposed on a ribbon cable carrier material 110. The cable 104 is then placed into the ribbon cable polarizing grooves 98 which are contained in the active connector housing top assembly 90. It is clearly obvious that these grooves 98 are of different diameters thereby allowing the cable 104 to be inserted in one direction only. The housing top assembly 90 is then mated with the lower assembly 126 such that the power conductor terminals 130 and signal conductor terminals 132 having insulation displacement areas 134 make electrical contact with the conductors 106, 108 contained in the cable 104. The retaining latches 92 contained on the top assembly 90 engage the retaining tabs 128 contained on the lower assembly 126, thereby regidly maintaining the cable 104 between the upper and lower assemblies 90, 126. Polarizing indentations A and B 94, 96 cooperate with polarizing tabs A and B 120, 122 respectively thereby insuring proper orientation of the cable 104 in the active connector assembly 148. Thereafter a stylus or other suitable tool (not shown) is inserted into the appropriate knockout pin apertures 144 contained in the lower assembly 126 thereby shearing the metal contained in the address pin knockout regions 142 of the active connector carrier strip 124. In this manner, the active connector assembly 148 thereby acquires its own unique "address", the operation of which will be more fully described below. Response/command plugs 150 are then mated with the active connector assembly 148, with the response/command wires 162, as mentioned previously, interconnected with the desired devices.

Referring now to FIGS. 10, 11 and 12 the construction and mating of the X connector assembly 182 is clearly shown. An X connector contact strip shown generally at 178 is, in the preferred embodiment of the present system, stamped in a continuous reel type basis from a metal such as beryllium copper. The strip 178 has X connector signal terminals 179 and X connector power terminals 181 each having insulation displacement areas 180 therein. The signal and power terminals 179, 181 are in an alternating relationship on the strip 178 to accommodate the power and signal conductors 106, 108 contained in the polarized ribbon cable 104. The strip 178 is cut into lengths of four pairs of terminals thereby accommodating four conductors in the cable 104, although it is to be understood that more or less may be utilized depending upon the number of conductors which may wish to be utilized in the cable 104. The power and signal conductors 179, 181 are then bent into the shapes shown as a unit of X connector contacts 176. The contacts 176 are then placed in between the two X connector inner assemblies 168, 168' such that the signal and power terminals 179, 181 are placed into the X connector insulation displacement contact apertures 170, 170'. If, as is desired in the preferred embodiment of the present system, the contacts 176 are placed as a unit between the inner assemblies 168, 168' a hand or machine tool is utilized to cooperate with the punch areas 171, 171' to sever the areas between the signal and power terminals 179, 181. Thereafter, in a manner similar to the active connector utilization, the cable 104 is placed into the grooves 98' of the X connector outer assemblies 164, 164'. The entire assembly is then mated such that the X connector retaining latches 166, 166' engage the inner assembly tabs 174, 174' contained on the X connector inner assemblies 168, 168'. Coincidentally with the mating is the electrical interconnection of the appropriate portions of the contacts 176 to the conductors contained in the cable 104. In this manner, the outer and inner power conductors 106 for each cable 104 respectively, are electrically interconnected and similarly the outer and inner signal conductors 108 contained in the cable 104 are respectively electrically interconnected. This therefore forms an X connector assembly shown generally at 182. In the event that the cable 104, 104' is not to be connected in an X fashion but rather in a T fashion, the cable 104, 104' is simply not extended past the edge of the assembly 182.

Referring now to FIGS. 13, 14 and 15, termination of the cable 104' is shown. This termination may be for several reasons, among which is the need to provide a terminating resistance for impedence purposes to the end of the cable 104' or interconnection with additional circuitry such as a controller or microprocessor or port interface 46 (shown in FIG. 2). Shown is an end connector contact strip 189 which is similar to the contact strip 178 of FIG. 11. Accordingly, signal terminals are alternated with power terminals 179', 181' but only on one side of the contact strip 189. On the other side of the contact strip 189 are wire wrap or contact terminaing posts 187. In a manner similar to the connector contacts 176 of FIG. 10, connector contacts 184 are disposed between the connector inner assemblies 168, 168' with the metal disposed between adjacent terminals 179', 181' and which are severed or separated as previously described for the X connector. The cable 104' is then aligned with the grooves 98' contained in the outer assembly 164' which is identicave of that of the X or T connector. The inner assemblies 168, 168' and the cable 104' along with the outer assembly 164' and connector contacts 184 are then joined into one piece through the use of the retaining latches 166' in conjunction with the inner assembly tabs 174' identically to that described for the X connector. In this manner, the end connector uses the same components as the X or T connector with the exception of the end connector contacts 184 and the omission of one outer assembly 164'. The entire assembly is then mated with the circuit board 186 which in the preferred embodiment is a printed circuit board having plated through holes disposed in the printed circuit board apertures 188. The printed circuit board apertures engage the terminating posts 187 and thereafter conductive strips (not shown) contained on the circuit board 186 which are interconnected with the appropriate resistor or electrical components (not shown). It is to be understood that in the event that the cable 104' is to be terminated through use of a resistor that the appropriate value of resistance chosen is dependent on a number of obvious factors such as cable length, number of active devices placed onto the cable as well as the input/output impedence for any controllers and each individual active connector. Accordingly, an end connector assembly 190 is readily obtainable. Also clearly shown is that the cable 104' may extend through both ends of the assembly 190 such that a microprocessor may be placed in between the ends of the task system thereby minimizing any impedence, signal reflectance or positioning problems which may be present.

Referring now to FIG. 3 there is shown a schematic of the logic portion of the present system, the operation of which will now be discussed. Here it can be seen where the connections for power $V_{cc}$, ground, master clock MCK bus 78 and the data bus 80 are made. Also shown are the four response terminals RE1, RE2, RE3 and RE4 which may be looked upon as providing a status indication for a monitored device. Also shown are the command terminals C1, C2, C3 and C4 which may be considered as control signals. Further shown are the address lines $A_3$, $A_4$, $A_5$, $A_6$, $A_7$ and $A_8$ which define the particular address or recognition number for each individual logic package 100. Since six address lines are utilized $2^6$ or 64 logic packages 100 may be utilized. In the event that more logic packages 100 are desired additional address lines may be added with the appropriate addition of gating circuitry such as the NOR gates found in U-6 and U-5/A. However, since only six address lines are utilized each logic package 100 in the preferred embodiment is then capable of four response and four command signals. The actual manner of identifying each logic package 100 with the unique address is relatively simple and may be realized by referring to the present figure in conjunction with FIG. 6 or 7. The address terminals A3 through A8 are presented as contact pads 102 contained on the exterior of the logic package 100. These contact pads make electrical contact with the contact legs 143 contained in the active connector carrier strip 124 being presented to the contact legs 143 which are in electrical contact with the address pin knockout regions 142. In this manner, power in the form of Gnd which is provided by the power conductor terminal 130 is always presented to the address lines. By severing the electrical connection at the address pin knockout region 142 in a manner previously described, Gnd is thereby removed from the appropriate address line thereby leaving some or all of the address lines tied low to Gnd or left floating. The master clock terminal 78 receives a timing signal which is placed on the cable 104 over the signal conductor 108. This master clock signal is introduced to device U-2 which is a one-shot monostable multivibrator. This multivibrator provides a manner to start a count in the logic package 100 for address identification purpose. Accordingly, as long as the clock pulse received over the bus 78 alternates between high and low as it normally should the output Q will remain high. However in the event that there is an absence of a high from the clock bus 78 for one or more time slots (a time slot being defined as two pulses) synchronous 4-bit-counters U-3 and U-4 will reset. With the continuation of the clock pulses the 4-bit-counters U-3 and U-4 begin to count the appropriate number of time slots. The outputs of synchronous 4-bit-counter U-3 and a portion of synchronous 4-bit-counter U-4 are then presented to exclusive NOR gate U-6. Thereafter when these outputs from 4-bit-counters U-3 and U-4 match the address presented by address lines $A_3$ through $A_8$, a true condition is presented to the enabled input of 3-8 line decoder U-9. Once the decoder U-9 is enabled, command terminal C-1 and response terminal RE-1 are gated in that order with a similar operation occurring for C-2 in conjunction with RE-2 and C-3 in conjunction with RE-3 and C-4 in conjunction with RE-4. Contemporaneously with the gating of a command and response terminal is the extraction from or insertion onto the data bus through terminal 80. Accordingly, exclusive NOR gate U-5/B toggles with the master clock signal which therefore clocks synchronous 4-bit-counters U-3 and U-4 along with J-$\underline{K}$ flip flop. Therefore, for examplary purposes only, were one to assign an address code to FIG. 3 the circuit would function as follows. After the one shot monostable multivibrator U-2 has reset and thereby cleared devices U-3, U-4 and U-7 exclusive NOR gate U-5B would begin toggling in time with the master clock signal which is provided by the master processing circuitry (not shown). This would therefore begin a count sequence in synchronous 4-bit-counter U-3 and U-4 as well as setting up a toggling $\underline{Q}$ signal emanating from J-$\underline{K}$ flip flop U-7. Upon the time slot, pulse the counter numbers of U-3 and U-4 would match the address code presented by address lines $A_3$ through $A_8$ (000100 with $A_8$ being the first 0 on the left and therefore the most significant while $A_3$ is represented by the last number shown and is the least significant with the result that the address pin knockout region 142 for $A_5$ would be intact and therefore tied to Gnd with the remainder of the regions for $A_3$, $A_4$ and $A_6$ *through* $A_8$ removed). Therefore, a true condition would exist for the outputs of exclusive NOR gates U-5/A and U-6 which are presented to the enable terminal EN-1 of the 3 to 8 line decoder U-9. This 3 to 8 line decoding from U-9 is in essence decoding the outputs of $O_A$ and $O_B$ of counter U-4 and the $\underline{Q}$ terminal of J-$\underline{K}$ flip flop U-7. Therefore, as the decoder U-9 essentially presents a true condition to its output, this is presented to the NOR gates of U-8 and the OR gates of U-10 in a successive fashion. This therefore, for the command terminals, allows any data pulse or condition which is on the data bus to be toggled through the associated D-type flip flops of U-12 and U-13 to each device which is to be controlled and therefore, for example, turning on or off a particular device. Similarly, with the successive true condition outputs presented by decoder U-9 to the OR gate U-10, a response signal is allowed to be presented to the data bus and thereby telling the master controller the status of the device which is being monitored such as, example, whether it is on, off, or within a particular temperature range. In this manner it is readily obvious how data is either inserted into or extracted from the data bus 80.

Figure 4:
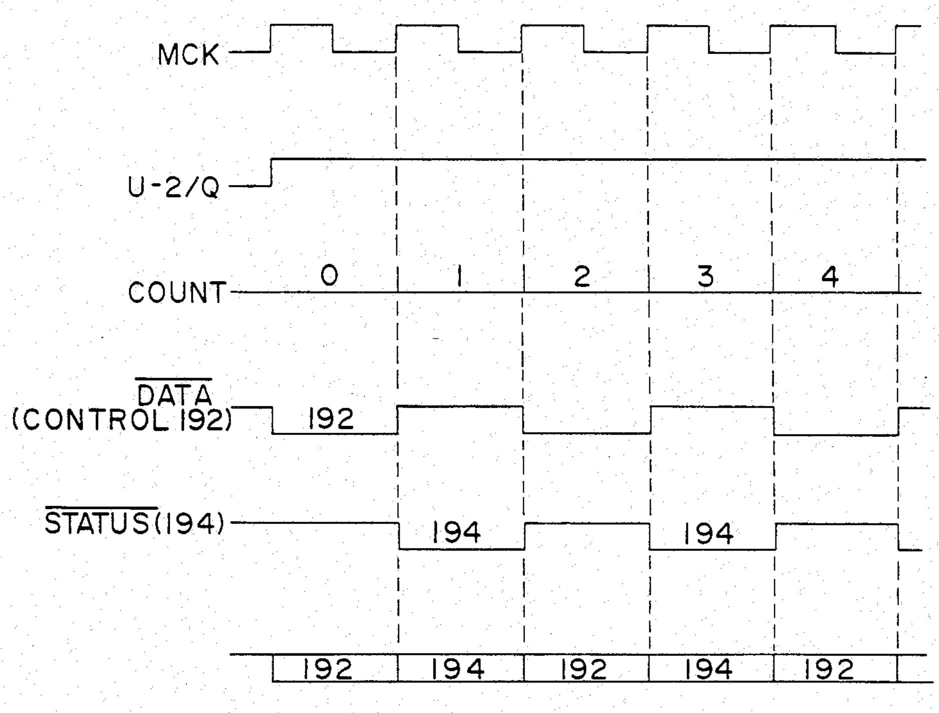
FIG. 4 is a timing diagram as utilized by the schematic of FIG. 3.

Referring now to FIG. 4, a timing diagram is shown for illustration purposes. Here it can be seen that the master clock signal MCK defines two pulses as a time slot. The one-shot monostable multivibrator U-2 shows a positive conditon upon the receipt of a master clock MCK pulse and would stay in this condition until the master clock pulse is low for one time slot. In this manner, the master processor can interrogate as many logic packages as many times as is desired before the master clock timing signal is allowed to remain low for one time slot. In the utilization of the present system it is preferred that after all 64 device logic packages have been sampled the master clock signal is allowed to go low for one time slot and thereby essentially provide a start signal at the beginning of each complete cycle. A count portion numbered 0–4 is shown in the present figure for ease of illustration. Although the count line is a data or control line 192 and a status timing sequence 194, the control and status signals correspond to command and response signals and therefore appear in an alternating fashion such that the bottom line of the timing diagram denotes control, status, control 192, 194, 192 etc.

It is to be understood that many variations of the present system may be utilized without departing from the spirit and scope of the present invention. For example, a greater or lesser number of address leads may be utilized with the result that a greater or lesser number of active connectors are used while the circuitry and protocol system may be used in a stand-alone mode external to a connector or in other types of connector systems. Further, the contacts or carrier strips may be comprised of metals other than copper such as aluminum or steel while the order in which commands and responses are utilized may be changed such that all responses or all commands within a particular logic package may be solicited before all commands or responses respectively are solicited. Also, different types of ribbon cable may be utilized while different shapes for polarization between connector, component and cable may be used or the spacing or sequence of power to signal conductors may be changed. Additionally, in the event that it is desired, a communication system may be initiated between the master controller and the logic package or between logic packages through the successive interrogation or commands with a particular sequence of pulses thereby designating a particular command or soliciting a particular response. The particular devices utilized in the schematic may also be changed or modified such as, for example, an OR gate in conjunction with an inverter. The timing function used with the one-shot monostable multivibrator may take the form of a free running flip-flop which is utilized, as mentioned previously, in conjunction with a counter. Also, the housings themselves may be moulded around the carrier or contact strips as opposed to the sandwiching which is presently shown. Additionally, different types of compliant pin type terminals may be used or different types of circuit boards other than printed such as silk screened or flexible membranes may be utilized.

Accordingly, and for the reasons discussed above the present device provides a system approach which is easy as well as inexpensive to manufacture, easy as well as inexpensive to apply and use and which provides for a extremely high degree of modularity and thereby facilitating the addition, subtraction or modification of units or features as desired.

We claim:

1. A cable connector having circuit components therein, comprising:

a housing top assembly having a profiled area to receive an electrical cable and having at least two latch members attached thereto;

an electrical cable having a plurality of wires therein disposed adjacent to said profiled area;

a housing intermediate assembly adjacent the top assembly and having a cable receiving channel therein, said channel in opposing relationship to said profiled area in said top assembly, said intermediate assembly further having contact receiving apertures therethrough;

a logic package having electrical components contained therein and conductive pads disposed on the outside thereof wherein said pads are electrically connected to said components;

a connector carrier strip adjacent to said intermediate assembly, said strip being characterized in that: said strip has a plurality of terminals bent up from the plane defined by said strip, said terminals cooperating with said apertures in said intermediate assembly and extending therethrough so as to have each of said terminals engage a wire in said cable, further characterized in that a plurality of contact legs are bent down from the plane defined by said strip, said legs facilitating electrical communication with said logic package and being further characterized in that pin apertures are disposed in said strip which allow for electrically conductive pins to be disposed therethrough and thereby in electrical communication with said logic package and/or said wires in said cable; and a housing lower assembly adjacent to said strip, profiled to receive said strip and having a lower assembly aperture therein profiled to receive said contact legs and said logic package, said lower assembly having lower assembly pin apertures therethrough which are aligned and cooperate with said pin apertures in said strip and said electrically conductive pins and further having retaining tabs cooperable with said latch members contained on said top assembly thereby fixedly holding said upper, intermediate and lower assemblies along with said strip and said cable together, thereby forming an active connector assembly.

2. A device according to claim 1 wherein said electrical cable is comprised of a ribbon cable.

3. A device according to claim 1 wherein said electrical component contained in said logic package are comprised of ceramic filters.

4. A device according to claim 1 wherein said electrical components contained in said logic package are comprised of resistive, capacitive or inductive components or a combination thereof.

5. A device according to claim 1 wherein said electrical components contained in said logic package are arranged so as to form a wire cross-over network.

6. A device according to claim 1 wherein the lower assembly has knockout pin apertures disposed therethrough, said knockout pin apertures being in alignment with portions of said contact legs such that upon assembly of the active connector assembly a stylus may be placed into said knockout pin apertures thereby physically and electrically severing the appropriate contact leg from the carrier strip and thereby electrically isolating a portion of the conductive pads contained on said logic package.

7. A device according to claim 1 wherein said electrically conductive pins are disposed in a plug, said plug having plug latch members which are cooperable with tab members contained on the lower assembly thereby allowing the plug containing said pins to be fixedly mated with said lower assembly and thereby said active connector assembly.

8. A device according to claim 7 wherein a polarizing bar is disposed on the underside of the lower assembly which cooperates with a polarizing groove disposed in the plug thereby allowing the plug to be mated with the lower assembly in one orientation only.

9. A device according to claim 1 wherein wires are connected to said electrically conductive pins and to external electrical apparatus, thereby facilitating electrical communication between said electrical apparatus and said logic package and/or said wires contained in said cable.

* * * * *